United States Patent
Shirasaka

(10) Patent No.: US 7,541,294 B2
(45) Date of Patent: Jun. 2, 2009

(54) SEMICONDUCTOR PACKAGE AND SEMICONDUCTOR PACKAGE MOUNTING METHOD

(75) Inventor: Kenichi Shirasaka, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 11/273,666

(22) Filed: Nov. 14, 2005

(65) Prior Publication Data

US 2006/0060948 A1     Mar. 23, 2006

Related U.S. Application Data

(60) Continuation of application No. 10/732,309, filed on Dec. 11, 2003, now Pat. No. 6,979,910, which is a division of application No. 10/119,315, filed on Apr. 10, 2002, now Pat. No. 6,861,282.

(30) Foreign Application Priority Data

| Apr. 13, 2001 | (JP) | ............... P2001-115380 |
| Mar. 20, 2002 | (JP) | ............... P2002-079371 |

(51) Int. Cl.
| H01L 21/31 | (2006.01) |
| H01L 21/469 | (2006.01) |
| H01L 23/04 | (2006.01) |
| H01L 32/50 | (2006.01) |
| H01L 23/544 | (2006.01) |

(52) U.S. Cl. ............... 438/765; 257/797; 257/730; 257/786

(58) Field of Classification Search ............... 257/797, 257/401, 462, 678, 730, 737, 780, 782, 786; 438/424

See application file for complete search history.

(56) References Cited

U.S. PATENT DOCUMENTS

| 4,885,126 | A | * | 12/1989 | Polonio | ............... 361/757 |
| 5,644,102 | A | * | 7/1997 | Rostoker | ............... 174/52.1 |
| 5,949,137 | A | * | 9/1999 | Domadia et al. | ............... 257/712 |
| 6,130,115 | A | * | 10/2000 | Okumura et al. | ............... 438/124 |
| 6,326,243 | B1 | * | 12/2001 | Suzuya et al. | ............... 438/124 |

(Continued)

FOREIGN PATENT DOCUMENTS

JP     55-164846     11/1980

(Continued)

OTHER PUBLICATIONS

Korean Office Action issued Dec. 23, 2005.

(Continued)

Primary Examiner—Chuong Anh Luu
(74) Attorney, Agent, or Firm—Dickstein, Shapiro, LLP.

(57) ABSTRACT

To provide a semiconductor package mounting method, with excellent work efficiency, wherein the direction of a semiconductor package can be verified by a simple method before mounting. One corner of a square shaped display section provided on the surface of a semiconductor package body is chamfered such that the chamfer dimensions are different from those of the other corners. If image recognition by a camera determines that this chamfered part is located correctly, the orientation of a semiconductor package is determined to be correct. On the other hand, if image recognition determines that it is not located correctly, the orientation of the semiconductor package is adjusted until it is correct.

6 Claims, 12 Drawing Sheets

U.S. PATENT DOCUMENTS

| | | |
|---|---|---|
| 6,389,688 B1 | 5/2002 | Srivastava et al. |
| 6,403,401 B1 * | 6/2002 | Aquien et al. ............... 438/122 |
| 6,525,406 B1 | 2/2003 | Chung et al. |
| 6,979,910 B2 * | 12/2005 | Shirasaka ................... 257/797 |

FOREIGN PATENT DOCUMENTS

| | | | |
|---|---|---|---|
| JP | 62-20353 | * | 1/1987 |
| JP | 362020353 A | | 1/1987 |
| JP | 2-27742 | | 2/1990 |
| JP | 2-278380 | | 11/1990 |
| JP | 04-312959 | * | 1/1992 |
| JP | 404312959 A | | 1/1992 |
| JP | 05-003261 | | 1/1993 |
| JP | 05-013635 | | 1/1993 |
| JP | 05-067696 | | 3/1993 |
| JP | 5-218216 | | 8/1993 |
| JP | 05-243335 | | 9/1993 |
| JP | 5-267482 | | 10/1993 |
| JP | 5-280950 | | 10/1993 |
| JP | 05-326752 | | 12/1993 |
| JP | 05-335464 | | 12/1993 |
| JP | 6-77265 | | 3/1994 |
| JP | 6-104352 | | 4/1994 |
| JP | 6-123609 | | 5/1994 |
| JP | 6-151686 | | 5/1994 |
| JP | 07-183444 | | 7/1995 |
| JP | 7-283598 | | 10/1995 |
| JP | 9-17898 | | 1/1997 |
| JP | 9-260625 | | 10/1997 |
| JP | 10-50380 | | 2/1998 |
| JP | 10-125728 | | 5/1998 |
| JP | 10-270582 | | 10/1998 |
| JP | 11-017061 | | 1/1999 |
| JP | 11-45951 | | 2/1999 |
| JP | 11-087565 | | 3/1999 |
| JP | 11-237210 | | 8/1999 |
| JP | 11-298098 | | 10/1999 |
| JP | 11-330316 | | 11/1999 |
| JP | 2000-49446 | | 2/2000 |
| JP | 2000-183238 | | 6/2000 |
| JP | 2000-236146 | | 8/2000 |
| JP | 2001-15994 | | 1/2001 |
| JP | 2001-68586 | | 3/2001 |
| JP | 2001-297956 | | 10/2001 |
| KR | 2000-0018416 | | 4/2000 |
| KR | 2001-0013904 | | 2/2001 |
| TW | 445560 | | 7/2001 |

OTHER PUBLICATIONS

The People's Republic of China Office Action dated Sep. 10, 2004 (and English translation of same).

Korean Office Action dated Oct. 28, 2004 (and English translation of same).

Taiwanese Office Action dated Jul. 1, 2003 (and concise English translation of relevant portion).

* cited by examiner

FIG. 1A
FIG. 1B
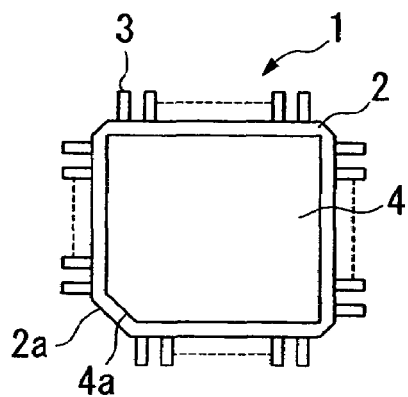
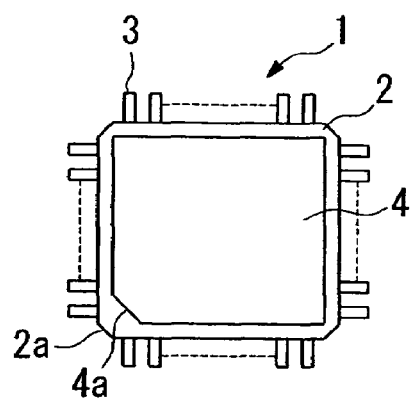
FIG. 2
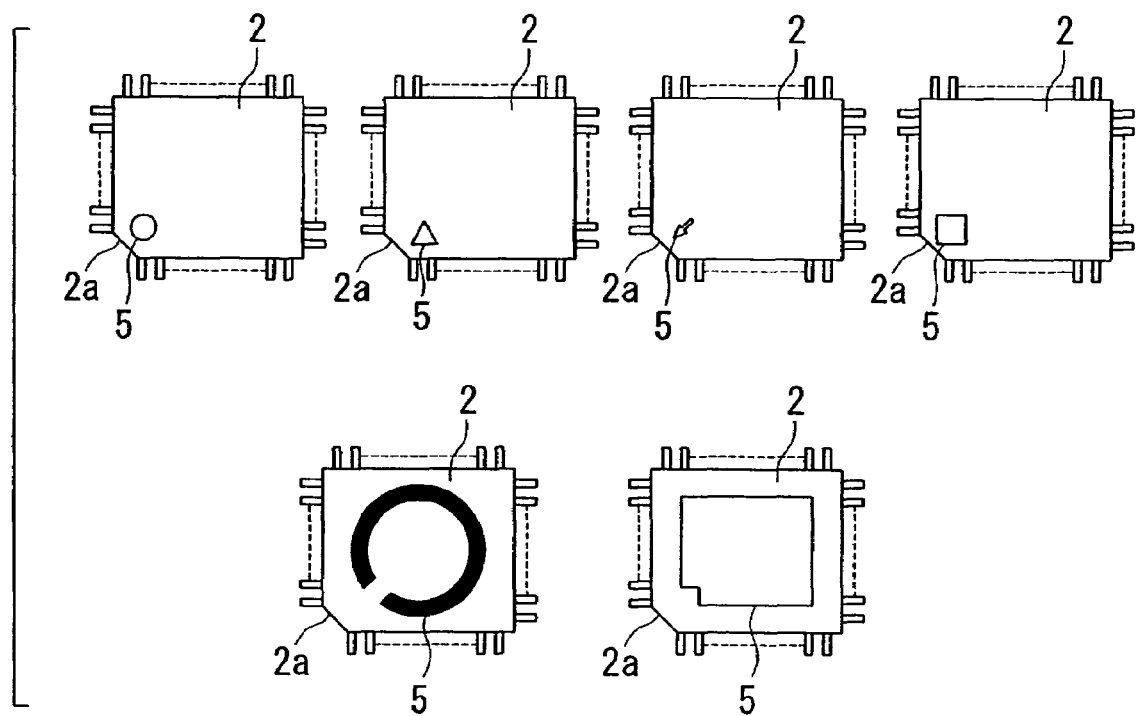

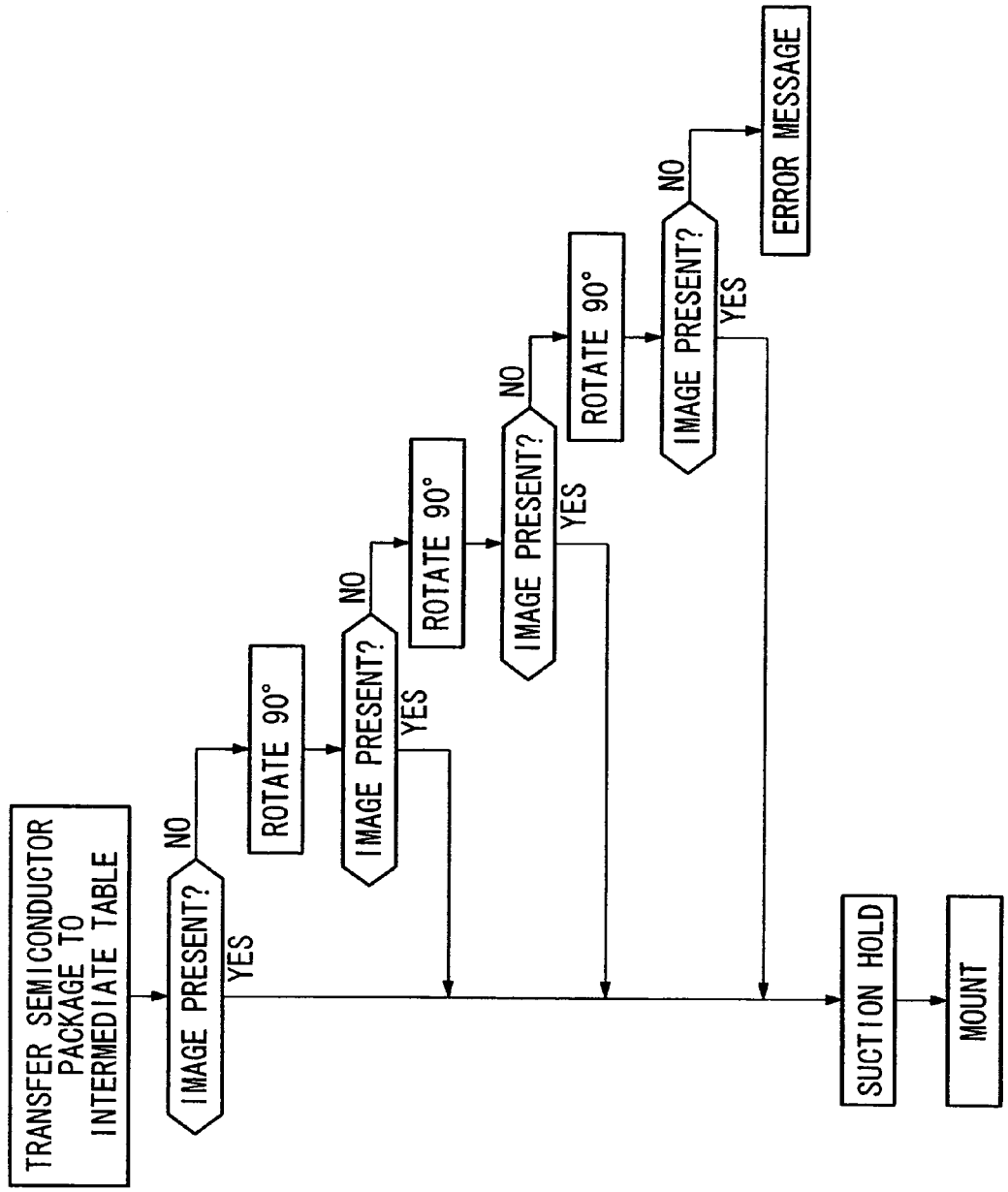

SEMICONDUCTOR PACKAGE AND SEMICONDUCTOR PACKAGE MOUNTING METHOD

CROSS REFERENCE TO RELATED APPLICATIONS

This application is a continuation of U.S. patent application Ser. No. 10/732,309, filed Dec. 11, 2003, now U.S. Pat. No. 6,979,910 which is a divisional of U.S. patent application Ser. No. 10/119,315, filed Apr. 10, 2002, now U.S. Pat. No. 6,861,282 entitled SEMICONDUCTOR PACKAGE AND SEMICONDUCTOR PACKAGE MOUNTING METHOD, the entire disclosure of which is incorporated herein by reference.

BACKGROUND OF THE INVENTION

1. Field of the Invention

The present invention relates to a semiconductor package and a semiconductor package mounting method. In particular, the invention relates to a semiconductor package for which it is easy to verify the orientation when mounting the semiconductor package onto a substrate and a semiconductor package mounting method.

2. Description of Related Art

Conventionally, mounting of semiconductor packages onto substrates has mainly been performed by the following two methods.

A first method involves image recognition of a lead location using a camera above the semiconductor package and verifying the orientation of the semiconductor package, after which the semiconductor package is mounted on the substrate and reflowed.

A second method involves image recognition of a lead position using a camera below the semiconductor package, after which the semiconductor package is mounted on the substrate and, after the orientation of the semiconductor package is verified by a camera above the mounted semiconductor package, it is reflowed.

In both cases, when verifying the orientation of the semiconductor package, it is determined whether the orientation is correct or not by image recognition of the shapes of chamfered corners of the semiconductor package. To be specific, as shown in FIG. 13, each of the corners of a semiconductor package 1 is chamfered, and the chamfer dimensions of one corner are made different from those of the other corners. It is determined whether the orientation of the semiconductor package is correct or not by image recognition of the location of the corner whose chamfer dimensions are different. When determining whether it is correct or not, a specified threshold value is set so as to determine whether there is a chamfer or not, and if it is determined that this threshold value is exceeded then the orientation is incorrect.

An example is proposed in Japanese Unexamined Patent Application, First Publication No. 2000-49446, wherein the direction of a semiconductor package is verified and then the semiconductor package is mounted on a substrate, so that the mounting location accuracy is improved.

However, since corner chamfer shapes of semiconductor packages differ depending on the semiconductor package assembler, in a case of mounting semiconductor packages manufactured by a plurality of assemblers, there is an inconvenience in that the image processing threshold value for image processing must be set for each assembler corresponding to the difference and dispersion of the chamfer dimension settings.

Furthermore, since the invention proposed in Japanese Unexamined Patent Application, First Publication No. 2000-49446 involves marking the substrate mounting side, and the location of a semiconductor package is determined by this marking, the direction of the semiconductor package can only be verified after mounting. Therefore, it is not possible to determine whether the direction of the package is correct or not by verifying the direction of the semiconductor package before mounting.

Furthermore, the prior art does not have a mechanism for recognizing the direction of a semiconductor package and rotating it to the correct direction. Therefore, there is a problem in that a semiconductor package placed in a tray or the like in an incorrect direction remains in the incorrect direction when mounting.

BRIEF SUMMARY OF THE INVENTION

The present invention takes such matters into consideration, with an object of providing a semiconductor package mounting method with excellent work efficiency, by verifying the orientation of a semiconductor package by a simple method and orientating it correctly before mounting it onto a substrate, and providing a semiconductor package to use for this mounting method.

In order to solve the above problems, a first aspect of the present invention is a semiconductor package on which there is provided an identification device for determining the orientation when the semiconductor package is mounted onto a substrate.

A second aspect of the present invention is that in the first aspect, the identification device comprises a square shaped display section provided on the surface of the package with at least one corner formed differently from the shapes of the other corners.

A third aspect of the present invention is that in the first and second aspect, the identification device is a label provided on the surface of the package.

A fourth aspect of the present invention is a semiconductor package mounting method comprising steps of; image recognition of a lead location of a semiconductor package, placing the semiconductor package on a substrate, image recognition of the orientation of the semiconductor package, and mounting the semiconductor package onto the substrate, wherein the step for image recognition of the orientation of the semiconductor package comprises a step for determining whether the orientation of the semiconductor package is correct by recognizing an identification device provided on the semiconductor package.

A fifth aspect of the present invention is that in the fourth aspect of the semiconductor package mounting method, recognition of the identification device provided on the semiconductor package is performed by dividing the surface of the semiconductor package into regions, then image recognition determines in which region the identification device is located, and the semiconductor package is rotated by an appropriate angle, depending on the location of the identification device, to orientate it correctly.

A sixth aspect of the present invention is that in the fourth aspect of the semiconductor package mounting method, recognition of the identification device provided on the semiconductor package is performed by image recognition of a certain region on the surface of the semiconductor package, then image recognition determines whether the identification device is in this region, and the semiconductor package is rotated as required, depending on whether the identification device is recognized or not, to orientate it correctly.

A seventh aspect of the present invention is a semiconductor package mounting method comprising steps of recognizing a lead location of a semiconductor package by laser beam, placing the semiconductor package on a substrate, recognizing the orientation of the semiconductor package by laser beam, and mounting the semiconductor package on the substrate, wherein the step for recognizing the orientation of the semiconductor package by laser beam comprises a step for determining whether the orientation of the semiconductor package is correct by scanning the surface of the semiconductor package by laser beam, and recognizing the location of an identification device provided on the semiconductor package by a reflectance pattern of reflected light or a change pattern of reflected light.

According to the present invention, it is possible to provide a semiconductor package for which the orientation of the semiconductor package can be easily verified when mounting the semiconductor package on a substrate, by chamfering one corner of a display section provided on the surface of the semiconductor package body by identical chamfer dimensions, or by attaching a label on the semiconductor package body at a predetermined location, even if the semiconductor package is made by a different assembler.

Furthermore, according to the present invention, it is possible to provide a semiconductor package mounting method, by which a semiconductor package can be orientated correctly on a substrate for mounting easily and accurately, by chamfering one corner of a display section provided on the surface of the semiconductor package by identical chamfer dimensions, or by image recognition of the semiconductor package on which a label is attached on the semiconductor package body at a predetermined location.

Moreover, according to the present invention, it is possible to provide a semiconductor package mounting method, by which a semiconductor package can be orientated correctly on a substrate for mounting easily and accurately, by chamfering one corner of a display section provided on the surface of the semiconductor package by identical chamfer dimensions, or by scanning the semiconductor package on which a label is attached on the semiconductor package body at a predetermined location, and recognizing the location of the identification device provided on the semiconductor package by the reflectance pattern of reflection light.

BRIEF DESCRIPTION OF THE SEVERAL VIEWS OF THE DRAWINGS

FIG. 1A and FIG. 1B are top views of a first example of a semiconductor package of the present invention.

FIG. 2 is a top view of a second example of a semiconductor package of the present invention.

FIG. 6A and FIG. 6B are diagrams showing another example of a method of determining the orientation of a semiconductor package.

DETAILED DESCRIPTION OF THE INVENTION

Figure 3:
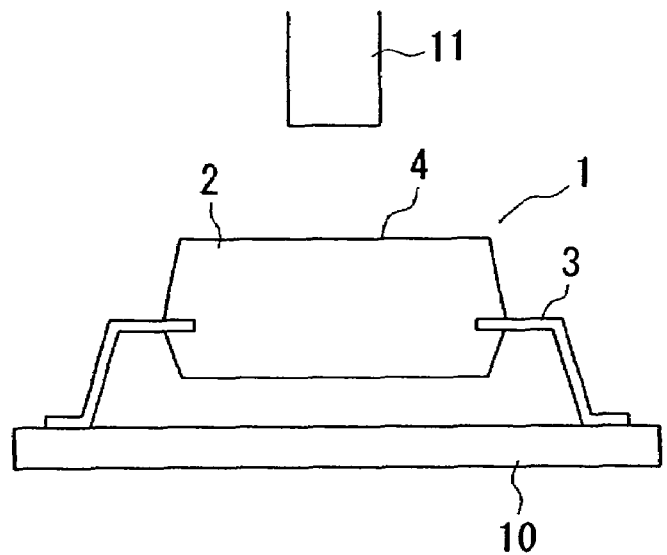
FIG. 3 is a diagram showing an example of a semiconductor package mounting method of the present invention.

As follows is a detailed description of the present invention.

Firstly, examples of a semiconductor package of the present invention will be described.

FIG. 1A and FIG. 1B are top views of a first example of a semiconductor package of the present invention.

In FIG. 1A and FIG. 1B, numeral 1 denotes the semiconductor package, numeral 2 denotes the semiconductor package body, and numeral 3 denotes a lead. One corner 2a of the semiconductor package body 2 is chamfered such that its chamfer dimensions are different from those of the other corners.

Since the semiconductor packages 1 shown in FIG. 1A and FIG. 1B are made by different assemblers, the chamfer dimensions of the corners 2a of the semiconductor package bodies 2 are different from each other.

Numeral 4 denotes a display section provided on the surface of the semiconductor package body 2. This display section is square shaped and follows the shape of the flat upper surface of the package body. A corner 4a, being one corner of this display section 4, is chamfered. This display section, or at least the chamfer dimensions of the display section, is made by a different assembler, and is made to be identical even if the semiconductor package has different chamfer dimensions. The chamfer dimensions referred to here mean measurements such as the length of the side, the angles and the like of the chamfered part of the display section.

In this manner, during image recognition of the display section 4 of the semiconductor package 1 in this example, the chamfered section is identified, the orientation of the semiconductor package 1 verified, and since one corner of the display section 4 on the semiconductor package 1 is chamfered by identical chamfer dimensions, the same threshold value can be used without setting a different image processing threshold value for image processing for each assembler.

In accordance with this example, it is possible to provide a semiconductor package such that the orientation of the semiconductor package can be verified easily when mounting the semiconductor package onto a substrate, by chamfering one corner of a display section 4 provided on the surface of the semiconductor package body 2 by identical chamfer dimensions, even if the semiconductor package is made by a different assembler.

Next is a description of a second example of a semiconductor package of the present invention.

FIG. 2 is a top view of the second example of a semiconductor package of the present invention.

Numeral 5 denotes a label provided in the vicinity of one corner 2a of the semiconductor package body 2, which is provided in order to verify the orientation of the semiconductor package when mounting the semiconductor package onto the substrate. This label 5 is attached by ink or laser radiation.

For the shape of the label 5, FIG. 2 shows a circle, a triangle, a square and an arrow. However, it is not limited to these. Any recognizable graphic shape may be used.

In accordance with this example, it is possible to provide a semiconductor package such that the orientation of the semiconductor package can be verified easily when mounting the semiconductor package onto a substrate, by providing a label 5 on the semiconductor package body 2 at a predetermined location, even if the semiconductor package is made by a different assembler.

In the above description, as a device for identifying the orientation of the semiconductor package 1, a device for chamfering one corner of a square shaped display section 4 provided on the surface of the semiconductor package body 2 by identical chamfer dimensions, and a device for attaching a label 5 on the semiconductor package body 2 at a predetermined location are used. However, one part of the display section may have a different shape from the other parts in one direction, and does not need to be a square shape. Furthermore, the display may be a combination of the above devices.

Here, in the present invention, the kind of semiconductor package 1 is not limited. It is applicable to all semiconductor packages such as QFP (Quad Flat Package), QFN (Quad Flat Non-leaded package), CSP (Chip Size Package) and the like.

Next is a description of an example of a semiconductor package mounting method of the present invention.

FIG. 3 shows an example of a semiconductor package mounting method of the present invention.

When placing a semiconductor package 1 on a substrate 10, after the position of a lead 3 is verified and adjusted by image recognition using a camera 11 from above the semiconductor package 1, the semiconductor package 1 is placed on the substrate 10.

Next, the camera 11 performs image recognition of the top face of the semiconductor package body 2. As shown in FIG. 1A and FIG. 1B, in the case of a semiconductor package 1 in which a corner 4a, being one corner of a display section 4, is chamfered by identical chamfer dimension, this chamfered section is recognized. Furthermore, as shown in FIG. 2, in the case of a semiconductor package 1 in which a label 5 is provided on the semiconductor package body 2 at a predetermined location, the location of the label 5 is recognized.

As a result, if the chamfered section of this corner 4a or the position of the label 5 is recognized correctly, it is determined that the orientation of the semiconductor package 1 is correct. On the other hand, if the chamfered section of the corner 4a or the label 5 is not recognized correctly, it is determined that the orientation of the semiconductor package 1 is not correct, and the orientation of the semiconductor package 1 is adjusted until it is determined to be correct.

As follows is a specific description of a method of determining the correctness of the orientation of the semiconductor package 1.

Here, a case wherein a characteristic label shown as one of the examples in FIG. 2 is attached at a corner of the display section 4 will be described. However, the case where a chamfered section is attached to the display section 4 is the same.

Figure 4:
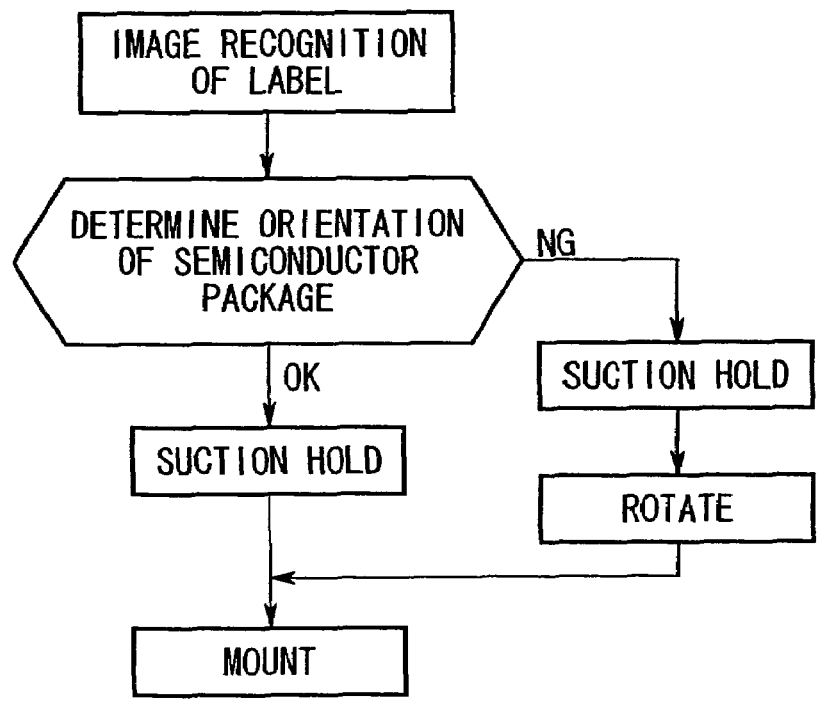
FIG. 4 is a diagram showing a method of determining whether the orientation of a semiconductor package is correct or not.

FIG. 4 is a flow chart showing a method of determining the correctness of the orientation of the semiconductor package 1.

Firstly, image recognition of the label attached at one corner of the display section 4 is performed. For this image recognition, image recognition data of an image of a semiconductor package 1 located in the correct position is converted into digital signals and stored in advance. Then, an image of the semiconductor package 1, being a measurement object, is converted into digital signals to obtain image recognition data.

Here, an image is taken from a CCD camera or the like, and outline enhancement and contrast enhancement are performed on this image to make it easy to compare the recognized image pattern with the other image pattern. With such contrast enhancement, since the semiconductor package 1 is normally dark brown, the recognized image pattern becomes pure black, so that it is easy to distinguish it from the printed character pattern. Furthermore, with outline enhancement, even in a case where recognition is difficult because of blurred shape, dirt, dust or the like, it is possible to extract only the outline characteristics. Therefore, it is possible to improve the error prevention rate.

Next, based on the abovementioned image recognition data, the correctness of the orientation of the semiconductor package 1 is determined. That is, it is determined whether the image recognition data of a semiconductor package 1 in the correct position and the image recognition data of the semiconductor package 1, being the measurement object, are identical or not. As a result of this determination, if the image recognition data are identical, the orientation is correct, so the semiconductor package 1 is suction held and mounted onto the substrate 10. On the other hand, if the orientation is not appropriate, the semiconductor package 1 is rotated in an appropriate direction after suction holding, and is then mounted onto the substrate 10.

Another method of determining correctness of the orientation of the semiconductor package 1 will be described in FIG. 5A and FIG. 5B.

Figure 5A:
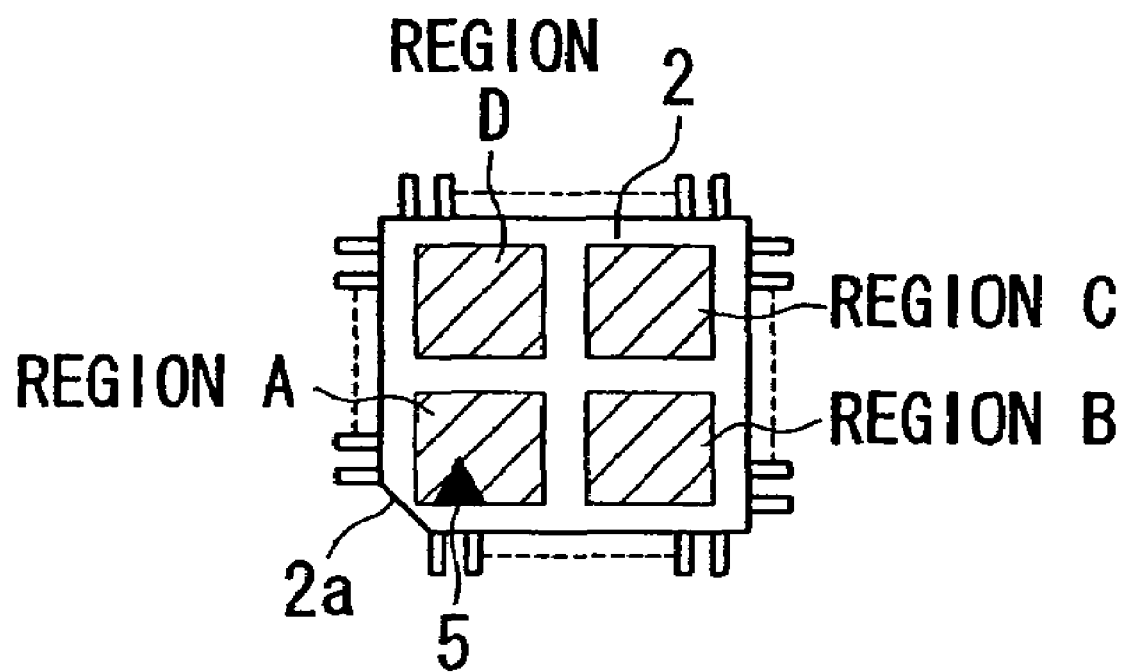
FIG. 5A and FIG. 5B are diagrams showing an example of a method of determining the orientation of a semiconductor package.

In FIG. 5A, an image recognition region of a semiconductor package body 2 is divided into four regions: region A, region B, region C and region D. Here, the orientation is correct when a label 5 is in region A.

Figure 5B:
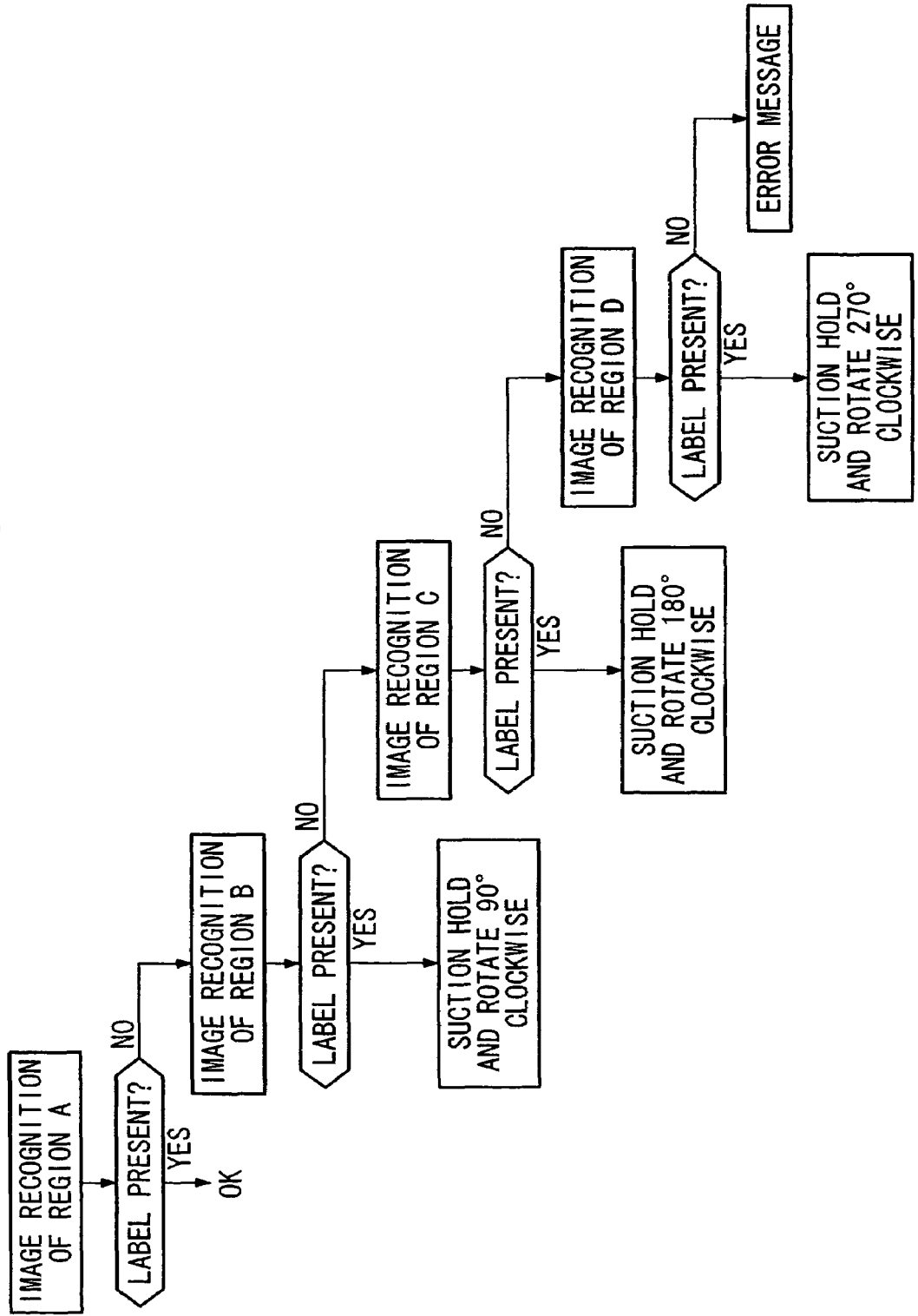

FIG. 5B is a flow chart showing an example of a method of determining the orientation of the semiconductor package 1. Firstly, image recognition of region A is performed. If the label 5 is recognized in this image recognition of region A, the semiconductor package 1 is determined to be in the correct direction. If the label 5 is not recognized, image recognition of region B is performed, and if the label 5 is recognized, the semiconductor package 1 is suction held and then rotated clockwise by 90°. If the label 5 is not recognized, image recognition of region C is performed.

If the label 5 is recognized in this image recognition of region C, the semiconductor package 1 is suction held and then rotated clockwise by 180°. If the label 5 is not recognized, image recognition of region D is performed, and if the label 5 is recognized, the semiconductor package 1 is suction held and then rotated clockwise by 270°. If the label 5 is not recognized, an error message is issued.

Here, in the above description, image recognition of the four regions, region A, region B, region C and region D, is performed sequentially. However, a method may be used in which image recognition of the whole of region A, region B, region C and region D is performed simultaneously, and this recognition pattern is compared with a recognition pattern stored and registered when the semiconductor package 1 is in the correct orientation.

Another method for determining the suitability of the orientation of the semiconductor package 1 will be described in FIG. 6A and FIG. 6B.

In this example, the semiconductor package 1 is placed on an intermediate table capable of rotating, and the semiconductor package 1 is rotated as required at each image recognition to orientate it correctly.

Figure 6A:
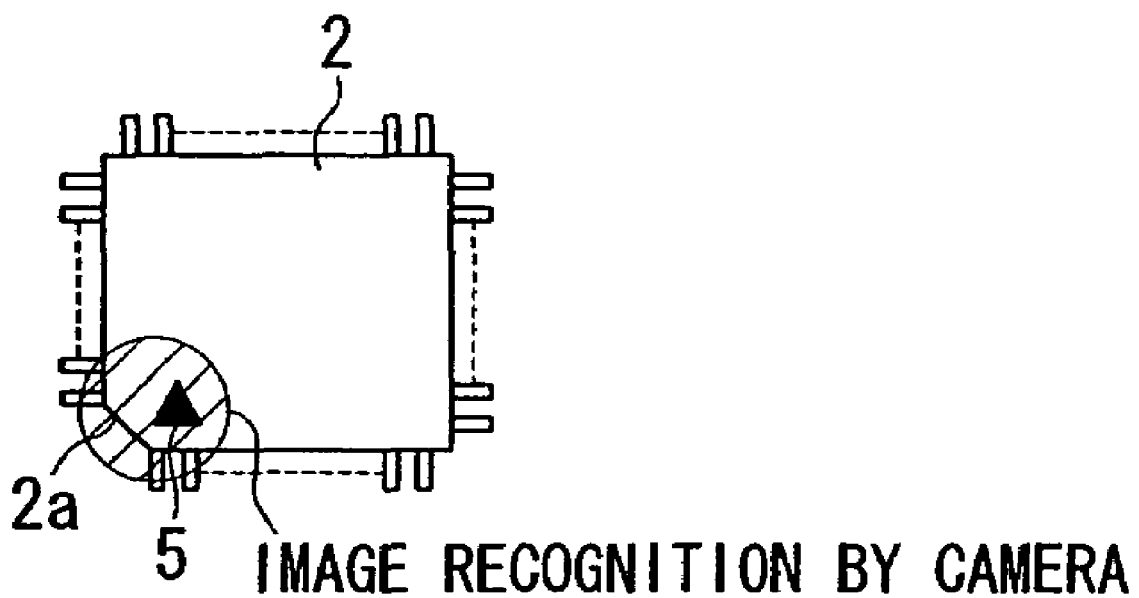

FIG. 6A shows image recognition by a CCD camera of a region in the vicinity of one corner 2a of a semiconductor package body 2. Here, a case is shown where, since the semiconductor package 1 is in the correct orientation, image recognition of a label 5 attached on the semiconductor package body 2 is performed by the CCD camera.

FIG. 6B is a flow chart showing a method of determining the orientation of the semiconductor package 1 in this example. After the semiconductor package 1 is transferred onto the intermediate table, image recognition of a specified region of the semiconductor package body 2 is performed by the CCD camera. If the label 5 is recognized in this image recognition, the semiconductor package 1 is determined to be in the correct direction, and it is suction held and then mounted onto the substrate.

If the label 5 is not recognized, the semiconductor package 1 is rotated by 90° and then image recognition is performed. If the label 5 is recognized in this image recognition, the semiconductor package 1 is determined to be in the correct direction, and is suction held and then mounted onto the substrate. If the label 5 is not recognized, the semiconductor package 1 is rotated by a further 90° and then image recognition is performed. If the label 5 is recognized in this image recognition, it is determined that the semiconductor package 1 is in the correct direction, and after suction holding it is mounted onto the substrate. If the label 5 is not recognized, the semiconductor package 1 is rotated by a further 90° and then image recognition is performed. If the label 5 is recognized in this image recognition, the semiconductor package 1 is determined to be in the correct direction, after suction holding it is mounted onto the substrate. If the label 5 is not recognized, an error message is issued.

Furthermore, for a method of correcting the orientation of a semiconductor package 1, instead of image recognition as described above, it is also possible to correct the orientation of the semiconductor package 1 by scanning the surface of the semiconductor package body 2 by a laser beam and measuring the reflected light. As follows is a description of a specific example.

Figure 7A:
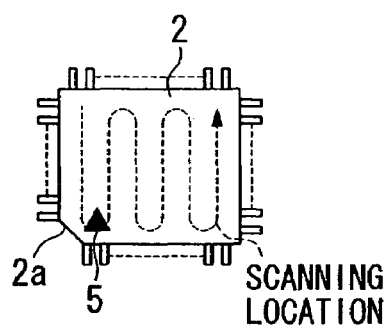
FIG. 7A and FIG. 7B are diagrams showing a method of orientating a semiconductor package correctly by scanning with a laser beam.
Figure 7B:
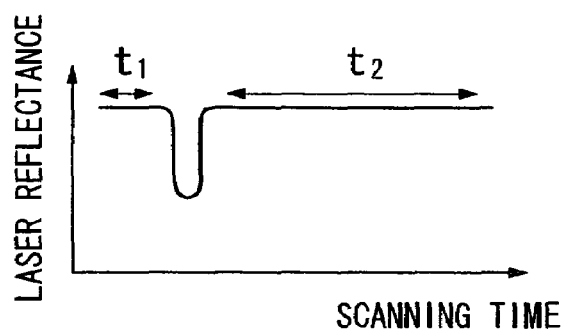

FIG. 7A, FIG. 7B, FIG. 8A and FIG. 8B show a method of correcting the orientation of a semiconductor package 1 by scanning by laser beam. FIG. 7A shows scanning of the semiconductor package body 2 progressively from one end as shown by a broken line in the figure, and FIG. 7B illustrates the reflectance of the laser beam reflected from the surface of the semiconductor package body 2 with scanning time on the horizontal axis. Here, as shown in FIG. 7A, the label 5 is painted white or the like so that its light reflectance is different from the other parts of the package body 2, which are black.

As shown in FIG. 7B, since the reflectance dips when a laser beam strikes the label 5, it is possible to detect the location of the label 5 attached to the semiconductor package body 2 from the relationship between scan time $t_1$ until reaching the point at which the reflectance dips and scan time $t_2$ after passing the point at which the reflectance dips. Based on this detected location of the label 5, the semiconductor package 1 is rotated by the required angle to orientate it correctly.

Figure 8A:
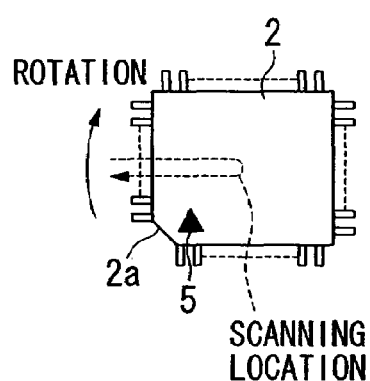
FIG. 8A and FIG. 8B are diagrams showing a method of orientating a semiconductor package correctly by scanning with a laser beam.

FIG. 8A shows a case where the semiconductor package 1 is placed on an intermediate table capable of rotating, and the semiconductor package 1 is scanned by laser beam during successive 90° rotations. In this case, the laser beam scans linearly as shown in FIG. 8A.

Figure 8B:
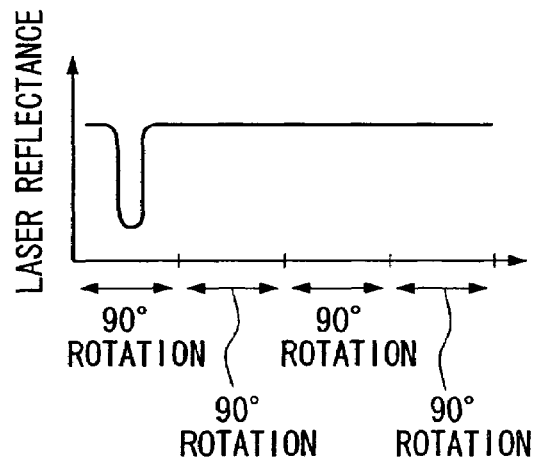

FIG. 8B illustrates the reflectance of laser beam reflected from the surface of the semiconductor package body 2 for each 90° rotation in the case of scanning by laser beam as in FIG. 8A. By using such a method, it is possible to detect the direction in which the semiconductor package 1 is orientated from the rotation time at which the reflectance dips, and it is possible to orientate the semiconductor package 1 correctly based on this information. FIG. 8A and FIG. 8B show a case where it is confirmed that because the point at which the reflectance dips is detected during the first rotation, this semiconductor package 1 is orientated correctly.

Figure 9A:
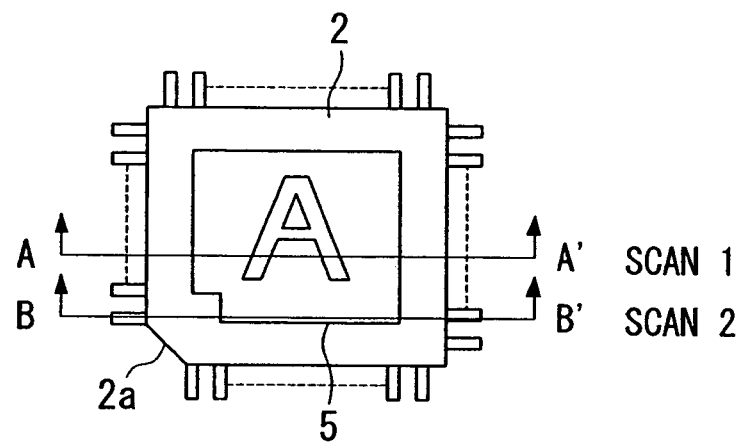
FIG. 9A and FIG. 9B are diagrams showing a method of orientating a semiconductor package correctly by scanning with a laser beam.
Figure 9B:
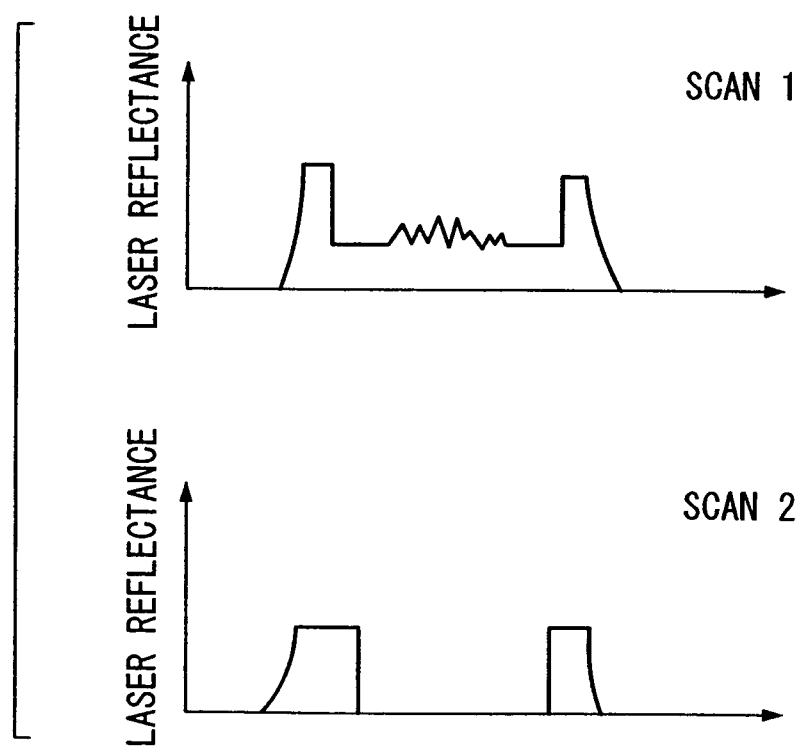

FIG. 9A and FIG. 9B show another example of a method of correcting the orientation of the semiconductor package 1 by scanning by laser beam.

In this example, as shown in FIG. 9A, a label 5, which is painted white or the like in order to improve light reflectance, is provided on the surface of the semiconductor package body 2, and a mark such as a logo is displayed on this label 5 by being left in black. Furthermore, a cutout is provided at one corner of the label 5, and when this cutout is located as shown in FIG. 9A, the semiconductor package 1 is orientated correctly.

By forming the label 5 in this manner, when the surface of the semiconductor package body 2 is scanned by laser beam, the reflectance pattern of reflected light changes depending on the scan position. FIG. 9B shows the change of reflectance of the laser beam depending on the scan position when scanning by laser beam.

For example, in the case of scan 1, the time from when the scan is started until the laser beam reaches the label 5 is short. However, in the case of scan 2, since the laser beam passes through the cutout of the label 5, the time until the laser beam reaches the label 5 is long. Since the reflectance of reflected light is low when the laser beam passes through the black part of the label 5, the peak width of the reflected light is narrow in scan 1, and the peak width of the reflected light is wide in scan 2. In this manner, the peak width of reflected light differs depending on the scan position.

In the case where the orientation of the semiconductor package 1 is not correct, since the cutout part of the label 5 is not in the position shown in FIG. 9A, the peak width of the reflected light is not as shown in FIG. 9B. As a result, it is possible to determine the correctness of the orientation of the semiconductor package 1, and it is possible to correct the orientation of the semiconductor package 1.

In the above, for a method of correcting the orientation of a semiconductor package 1, a case wherein laser beam scanning is performed by attaching a label or the like on the surface of the semiconductor package body 2 is described. However, any other method, wherein correction of the orientation is performed based on a change of reflectance of laser beam, may be used. As an example, a method will be described in which a difference in level is provided on the surface of the semiconductor package body 2 to see a change of the reflectance pattern.

Figure 10A:
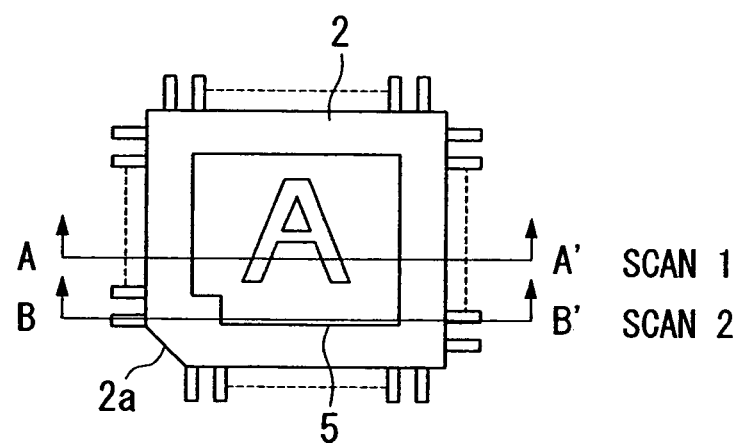
FIG. 10A, FIG. 10B and FIG. 10C are diagrams showing a method of orientating a semiconductor package correctly by scanning with a laser beam.
Figure 10B:
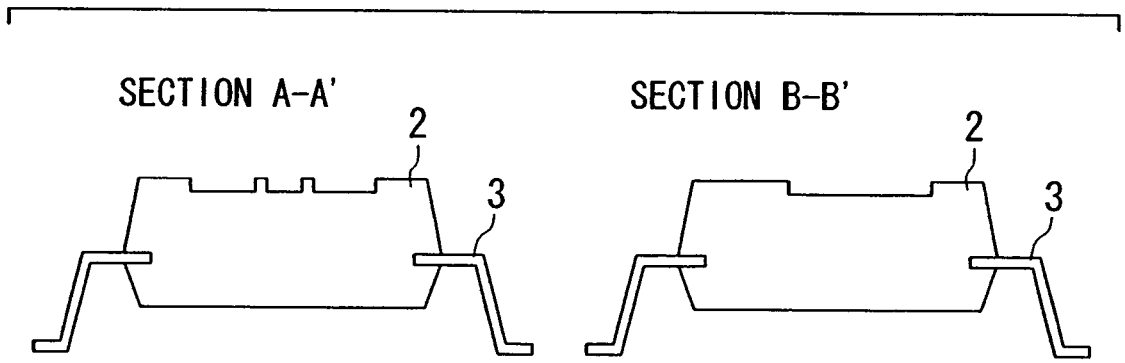

In FIG. 10A a difference in level part provided on a part of the surface of a semiconductor package body 2 is shown, and FIG. 10B shows a cross section A-A' and a cross section B-B' of this semiconductor package body 2.

Laser beam scanning is performed of the semiconductor package on which a difference in level is provided in this manner. Reflected light intensity is measured using a detector that can receive the laser beam reflected from the surface of the semiconductor package body 2 through a polarizing screen. This reflected light has no phase instability at the upper part of the level difference and the lower part of the level difference, but has phase instability at the boundary part.

Figure 10C:
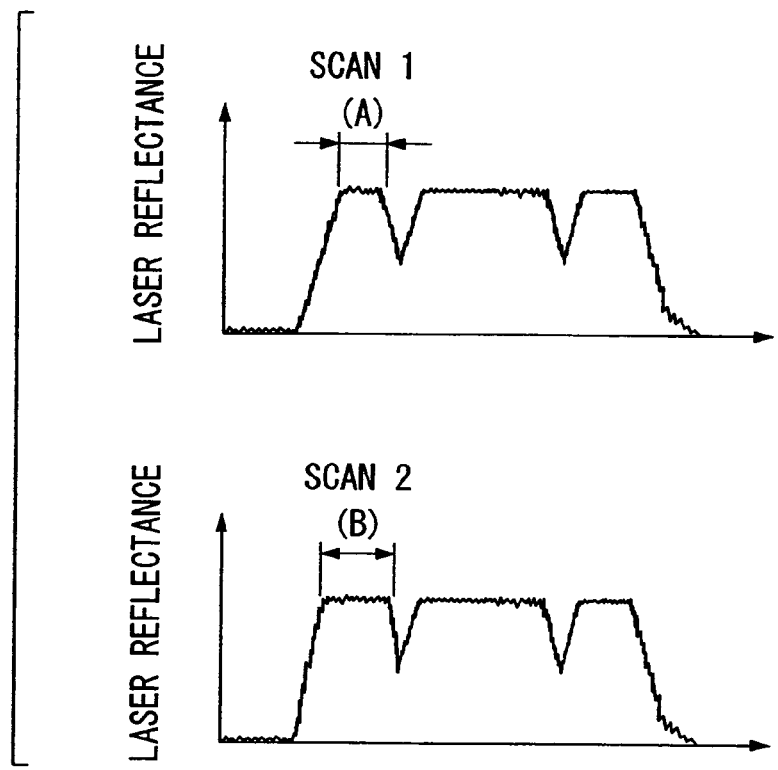

FIG. 10C shows the appearance of this reflected light. Since the scan positions are different between scan 1 and scan 2, it is possible to recognize the orientation by the difference between peak widths (A) and (B) of the reflected light as shown in FIG. 10C.

Figure 11:
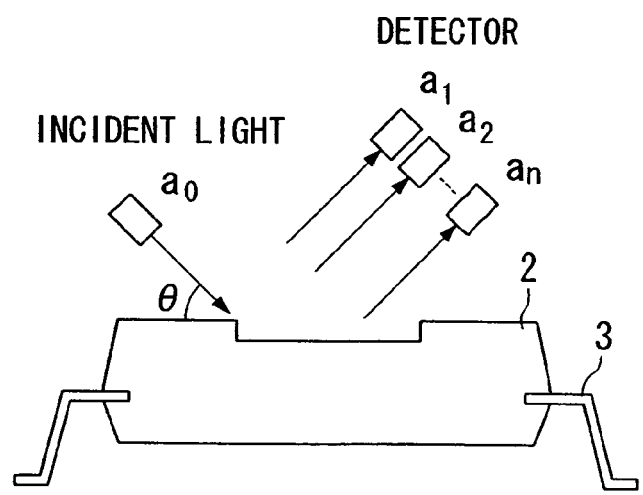
FIG. 11 is a diagram showing an example of the positions of incident light and detectors when scanning with a laser beam.

FIG. 11 shows a case where a laser beam is radiated obliquely toward the surface of the semiconductor package body 2 and the reflected light is received from the surface of the semiconductor package body 2 by a detector.

In FIG. 11, an incident light $a_0$ is radiated from a direction at an angle θ to the surface of the semiconductor package body 2, a detector is mounted obliquely and the position of this detector is moved through $a_1, a_2, \ldots a_n$. The intensity of the reflected light where the level of the surface of the semiconductor package body 2 changes is different compared with the intensity of the reflected light at the other places. As a result, it is possible to identify the position of the surface level difference.

Furthermore, it is also possible to measure the height using the phase difference of reflected light from the section where the level of the surface of the semiconductor package 2 changes. In this case, the height is measured by counting the number of moiré fringes caused by the phase difference of the reflected light.

Next is a description of a method of justifying the orientation of a semiconductor package 1 by the location of the No. 1 pin mark provided on the semiconductor package body 2.

Figure 12A:
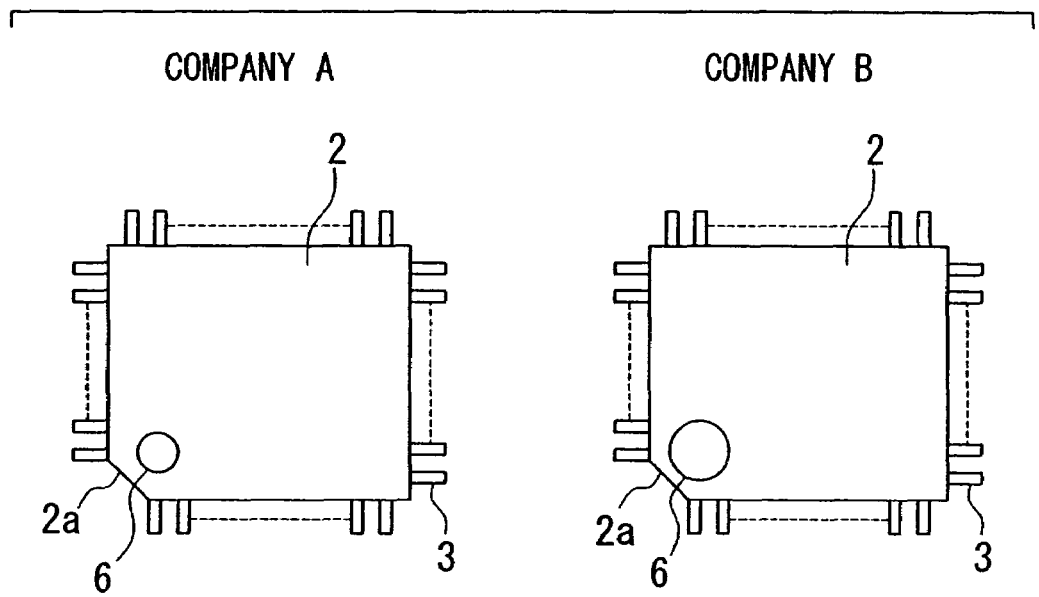
FIG. 12A and FIG. 12B are diagrams showing a method of orientating a semiconductor package correctly by scanning with a laser beam.
Figure 12B:
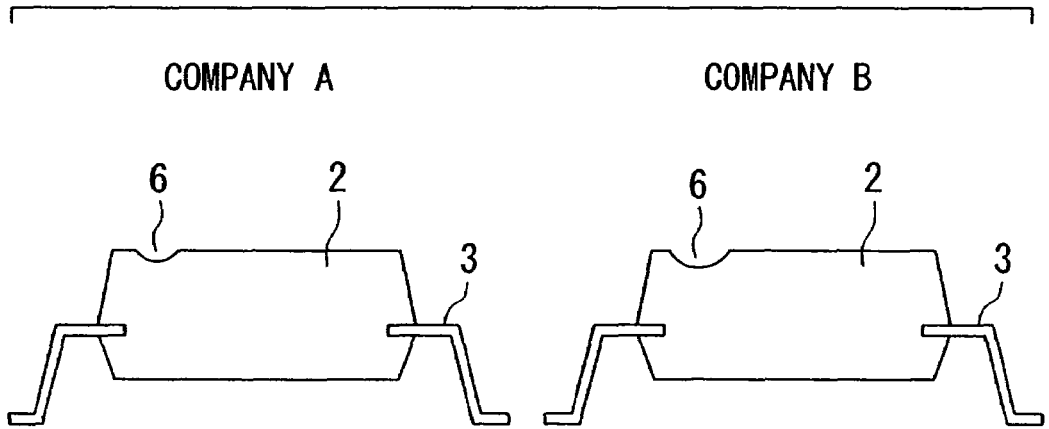
Figure 13:
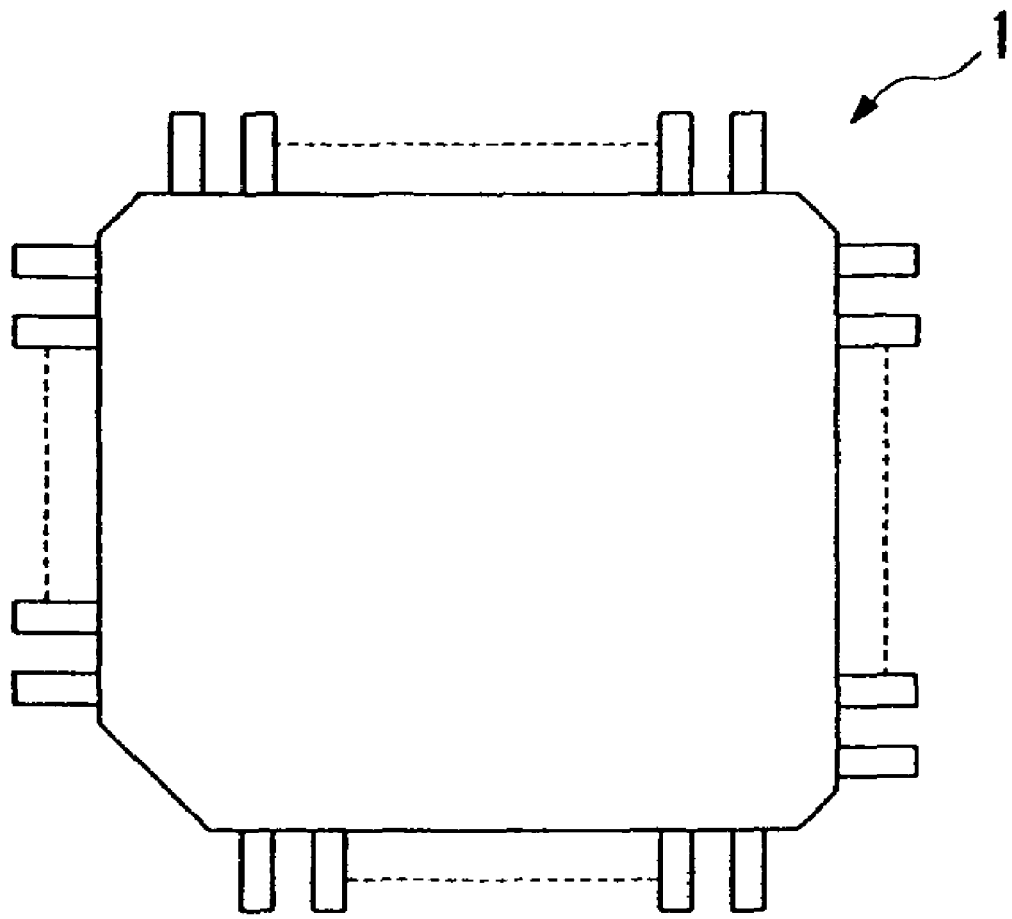
FIG. 13 is a diagram showing an example of a conventional semiconductor package.

FIG. 12A shows a No. 1 pin mark provided on the surface of the semiconductor package body 2, and FIG. 12B shows its side view. As shown in FIG. 12A and FIG. 12B, the size of the No. 1 pin mark normally differs between manufacturers. Here, the No. 1 pin mark of company B is larger than the No. 1 pin mark of company A.

In this manner, even if the size of the No. 1 pin mark provided on a semiconductor package 1 differs, by measuring the light reflected by scanning with a laser beam, the level difference of the No. 1 pin mark is detected, and the location of the No. 1 pin mark can be recognized, so that it is possible to orientate the semiconductor package 1 correctly based on this information. Here, when scanning by laser beam, by radiating at an angle from the vertical onto the surface of the semiconductor package body 2, it is possible to distinguish the difference of signal level more accurately.

By a method as above, when the semiconductor package 1 is orientated correctly on the substrate 10, the semiconductor package 1 is mounted onto the substrate 10, after which the mounting of the semiconductor package 1 onto the substrate 10 is completed via a reflow step.

According to this example, by image recognition of a semiconductor package 1, where one corner of a display section 4 provided on the surface of a semiconductor package body 2 is chamfered by identical chamfer dimensions, or a label 5 is attached on the semiconductor package body 2 at a predetermined location, it is possible to provide a semiconductor package mounting method that can mount the semiconductor package 1 on a substrate 10 in the correct orientation easily and accurately.

Furthermore, by scanning the semiconductor package 1 by laser beam, where one corner of a display section 4 provided on the surface of a semiconductor package body 2 is chamfered by identical chamfer dimensions, or a label 5 is attached on the semiconductor package body 2 at a predetermined location, and by recognizing the location of the identification device provided on the semiconductor package 1 by the reflectance pattern of reflected light, it is possible to provide a semiconductor package mounting method that can mount the semiconductor package 1 on the substrate 10 in the correct orientation easily and accurately.

What is claimed is:

1. A semiconductor package having a polygon shaped top surface, said semiconductor package comprising:
    a chamfered portion of at least one corner of said semiconductor package; and
    a display section provided on a surface to be a top surface when said semiconductor package is mounted on a substrate, said display section having an identification portion formed in a vicinity of a specific corner of said semiconductor package and having a shape different from the other corners so as to make the specific corner distinguishable from the other corners,
    wherein said identification portion is dimensioned such that verification of the semiconductor package can be carried out by a plurality of different assemblers without altering a threshold value used for the verification.

2. The semiconductor package according to claim 1, wherein said display section is square shaped.

3. A semiconductor package having a polygon shaped top surface, said semiconductor package comprising:
    a chamfered portion of at least one corner of said semiconductor package; and
    an identification mark provided in a vicinity of specific corner of said semiconductor package on a surface to be a top surface when said semiconductor package is mounted on a substrate, and making the specific corner distinguishable from the other corners,
    wherein said identification mark is dimensioned such that verification of the semiconductor package can be carried out by a plurality of different assemblers without altering a threshold value used for the verification.

4. The semiconductor package according to claim 3, wherein said identification mark is formed by an ink mark.

5. The semiconductor package according to claim 3, wherein said identification mark is a laser mark.

6. The semiconductor package according to claim 3, wherein said identification mark is concave or convex.

* * * * *